(12) United States Patent
Kamiya et al.

(10) Patent No.: US 8,704,249 B2
(45) Date of Patent: Apr. 22, 2014

(54) SEMICONDUCTOR LIGHT EMITTING DEVICE

(71) Applicant: Toyoda Gosei Co., Ltd., Kiyosu (JP)

(72) Inventors: Masao Kamiya, Kiyosu (JP); Keisuke Kayamoto, Kiyosu (JP); Hitomi Saito, Kiyosu (JP); Hisanobu Noda, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 13/766,603

(22) Filed: Feb. 13, 2013

(65) Prior Publication Data
US 2013/0207153 A1 Aug. 15, 2013

(30) Foreign Application Priority Data
Feb. 14, 2012 (JP) .................................. 2012-029806

(51) Int. Cl.
*H01L 33/00* (2010.01)
*H01L 33/36* (2010.01)

(52) U.S. Cl.
USPC .. 257/91; 257/96; 257/E33.012; 257/E33.064

(58) Field of Classification Search
USPC ...................... 257/91, 96, E33.012, E33.064; 362/241; 438/25
See application file for complete search history.

(56) References Cited

U.S. PATENT DOCUMENTS

| 2004/0012958 A1 | 1/2004 | Hashimoto et al. |
| 2007/0228388 A1* | 10/2007 | Ko et al. ......................... 257/79 |
| 2011/0210345 A1* | 9/2011 | Lim et al. ........................ 257/88 |

FOREIGN PATENT DOCUMENTS

JP 2002-319705 A 10/2002

\* cited by examiner

*Primary Examiner* — Caridad Everhart
(74) *Attorney, Agent, or Firm* — McGinn IP Law Group, PLLC

(57) ABSTRACT

A semiconductor light emitting device includes: a first conductivity type semiconductor layer; a light emission layer; a second conductivity type semiconductor layer; a conductive portion of a first polarity electrically connected to the first conductivity type semiconductor layer; and a conductive portion of a second polarity electrically connected to the second conductivity type semiconductor layer. At least one of the conductive portion of the first polarity and the conductive portion of the second polarity includes a plurality of separated electrode portions arranged on a light emission surface. The closer the positions of the separated electrode portions are to a center point of the light emission surface, the separated electrode portions are provided sparsely, and the farther the positions of the separated electrode portions are from a center point of the light emission surface, the separated electrode portions are provided densely.

10 Claims, 10 Drawing Sheets

SEMICONDUCTOR LIGHT EMITTING DEVICE

BACKGROUND

1. Technical Field

The invention relates to a semiconductor light emitting device. More specifically, the invention relates to a semiconductor light emitting device having improved amount of emitted light.

2. Background Art

In a semiconductor light emitting device, it is preferable that a luminance distribution on a light emission surface of a light emission layer is uniform. When a current density on the light emission surface of a semiconductor layer is non-uniform, the deterioration progresses fast at a place at which large current flows. Also, the more uniform the current density on the light emission surface, the light emitted from the semiconductor light emitting device becomes brighter.

Therefore, a technology for making the luminance on the light emission surface uniform has been developed. For example, Patent Document 1 discloses a semiconductor light emitting device including electrodes having linear portions arranged at an equal interval on a chip surface (refer to a paragraph [0050] and FIG. 2 of Patent Document 1). The electrodes are formed over a whole area of the chip surface. Accordingly, a plurality of light emission portions that emits light between the linear electrodes opposed to each other in parallel is formed and a light emission surface of the semiconductor light emitting device is thus enabled to uniformly emit the light (refer to a paragraph [0052] of Patent Document 1).

Also, a semiconductor light emitting device is also disclosed in which a plurality of power feeders for feeding power to electrodes is provided (refer to FIGS. 23 and 24 of Patent Document 1).

Patent Document 1: JP-A-2002-319705

SUMMARY

However, even when the electrodes and power feeders are arranged as described above, the fact remains that the light emission surface is brightest near a center thereof. The reason is that current is apt to be concentrated near the center. That is, a current density is larger near the center of the light emission surface.

The invention has been made to solve the above problem, and an object thereof is to provide a semiconductor light emitting device in which an amount of emitted light is uniform on a light emission surface.

A semiconductor light emitting device according to a first aspect includes: a first conductivity type semiconductor layer; a light emission layer; a second conductivity type semiconductor layer; a conductive portion of a first polarity electrically connected to the first conductivity type semiconductor layer; and a conductive portion of a second polarity electrically connected to the second conductivity type semiconductor layer. At least one of the conductive portion of the first polarity and the conductive portion of the second polarity includes a plurality of separated electrode portions arranged on a light emission surface. The closer the positions of the separated electrode portions are to a center point of the light emission surface, the separated electrode portions are provided sparsely, and the farther the positions of the separated electrode portions are from a center point of the light emission surface, the separated electrode portions are provided densely.

The first conductivity type semiconductor layer is a p-type semiconductor layer or n-type semiconductor layer. The second conductivity type semiconductor layer is a p-type semiconductor layer or n-type semiconductor layer but is a semiconductor layer having a conductivity type different from the first conductivity type semiconductor layer. The first polarity is a positive pole or negative pole. The second polarity is a positive pole or negative pole that is a polarity different from the first polarity. The conductive portion includes a dot electrode, a wiring and a pad electrode.

In the semiconductor light emitting device, the separated electrode portions that feed power are arranged more at the peripheral portion of the light emission surface than at the center portion. Therefore, the current is more apt to flow at the peripheral portion in the light emission surface, compared to the conventional semiconductor light emitting device. Thus, a light emission intensity distribution in the light emission surface of the semiconductor light emitting device is more uniform, compared to a light emission intensity distribution of the conventional semiconductor light emitting device.

In the semiconductor light emitting device according to a second aspect, the plurality of separated electrode portion include: a first separated electrode portion; and a second separated electrode portion located at a position farther from the center point than the first separated electrode portion are provided. The second separated electrode portion includes an electrode portion having a second closest inter-electrode distance smaller than a first closest inter-electrode distance of the first separated electrode portion. The closest inter-electrode distance is a distance between the separated electrode portion and the conductive portion of the first polarity closest to the separated electrode portion or the conductive portion of the second polarity closest to the separated electrode portion. Accordingly, the fact remains that the current is more apt to flow at the peripheral portion in the light emission surface, compared to the conventional semiconductor light emitting device. Hence, the light emission intensity distribution in the light emission surface of the semiconductor light emitting device is more uniform, compared to the light emission intensity distribution of the conventional semiconductor light emitting device.

In the semiconductor light emitting device according to a third aspect, the closest inter-electrode distance is a distance between a separated electrode portion of the first polarity and the conductive portion of the second polarity. Since the distance between the separated electrode portion of the first polarity and the conductive portion (which includes the separated electrode portion, the wiring, the pad electrode and the like) of the second polarity is narrower at the peripheral portion, the light emission intensity distribution in the light emission surface of the semiconductor light emitting device is more uniform, compared to the light emission intensity distribution of the conventional semiconductor light emitting device.

In the semiconductor light emitting device according to a fourth aspect, each of the conductive portion of the first polarity and the conductive portion of the second polarity includes a plurality of the separated electrode portions. The closest inter-electrode distance is a distance between the separated electrode portion of the conductive portion of the first polarity and the separated electrode portion of the conductive portion of the second polarity. Since the distance between the separated electrode portion of the first polarity and the separated electrode portion of the second polarity is narrower at the peripheral portion, the light emission intensity distribution in the light emission surface of the semiconductor light emitting device is more uniform, compared to the light emission intensity distribution of the conventional semiconductor light emitting device.

In the semiconductor light emitting device according to a fifth aspect, only the conductive portion of the first polarity includes the plurality of the separated electrode portions. The closest inter-electrode distance is a distance between the separated electrode portion of the conductive portion of the first polarity and the conductive portion of the second polarity. In this case, the conductive portion of the second polarity does not have the separated electrode portion. Therefore, the distance between the separated electrode portion of the first polarity and the conductive portion (which includes the wiring, the pad electrode and the like) of the second polarity is narrower at the peripheral portion. Hence, the light emission intensity distribution in the light emission surface of the semiconductor light emitting device is more uniform, compared to the light emission intensity distribution of the conventional semiconductor light emitting device.

In the semiconductor light emitting device according to a sixth aspect, the conductive portion of the first polarity includes a comb wiring portion of the first polarity that electrically connects the separated electrode portions of the first polarity each other. The conductive portion of the second polarity includes a comb wiring portion of a second polarity that electrically connects the separated electrode portions of the second polarity each other. The farther from the center point of the light emission surface, the distance between the separated electrode portion on the comb wiring portion of the first polarity and the separated electrode portion on the comb wiring portion of the second polarity is made to be narrower. Thereby, the light emission intensity distribution in the light emission surface of the semiconductor light emitting device is more uniform, compared to the light emission intensity distribution of the conventional semiconductor light emitting device.

In the semiconductor light emitting device according to a seventh aspect, the conductive portion of the first polarity includes a comb wiring portion of a first polarity having a comb shape that electrically connects the separated electrode portions. The conductive portion of the second polarity includes a comb electrode portion of a second polarity having a comb shape. The closest inter-electrode distance is a distance between the separated electrode portion of the first polarity connected to the comb wiring portion of the first polarity and the comb electrode portion of the second polarity. The farther from the center point of the light emission surface, the distance between the separated electrode portion of the comb wiring portion of the first polarity and the comb electrode portion of the second polarity is made to be narrower. Thereby, the light emission intensity distribution in the light emission surface of the semiconductor light emitting device is more uniform, compared to the light emission intensity distribution of the conventional semiconductor light emitting device.

In the semiconductor light emitting device according to an eighth aspect, a ratio b/a is within a range of $1.05 \leq b/a \leq 1.45$, where "a" indicates the closest inter-electrode distance, which is between the separated electrode portion positioned on a first line farthest from the center point of the light emission surface and the separated electrode portion positioned on a second line farthest from the center point of the light emission surface next to the first line, and "b" indicates the closest inter-electrode distance, which is between the separated electrode portion positioned on a third line closest to the center point of the light emission surface and the separated electrode portion positioned on a fourth line closest to the center point of the light emission surface next to the third line. The light emission intensity distribution in the light emission surface becomes more uniform.

In the semiconductor light emitting device according to a ninth aspect, the ratio b/a of the closest inter-electrode distance b to the closest inter-electrode distance a is within a range of $1.15 \leq b/a \leq 1.35$. The light emission intensity distribution in the light emission surface becomes more uniform.

The semiconductor light emitting device according to a tenth aspect, the conductive portion of the first polarity includes the separated electrode portions of the first polarity. The closest inter-electrode distance is a distance between the separated electrode portions of the first polarity. The reason is as follows: also in a flip chip having a planar electrode portion of a plane shape, the distance between the separated electrode portions of the same polarity is made to be narrower at the peripheral portion, so that the light emission intensity distribution in the light emission surface becomes more uniform.

According to the invention, a semiconductor light emitting device in which an amount of emitted light is uniform on a light emission surface is provided.

DETAILED DESCRIPTION

Hereinafter, specific illustrative embodiments of the invention will be described with reference to the drawings while exemplifying a semiconductor light emitting device. However, the invention is not limited to the illustrative embodiments. That is, the invention can be applied to a light emitting device in which at least a part of p auxiliary electrodes and n auxiliary electrodes are separately (discretely) arranged. Also, a stacked structure of respective layers and an electrode structure in the light emitting device that will be described later are just exemplary. It doesn't matter whether a stacked structure is different from those of the illustrative embodiments. In the respective drawings, a thickness of each layer is conceptually shown and does not indicate an actual thickness.

First Illustrative Embodiment

1. Semiconductor Light Emitting Device

Figure 1:
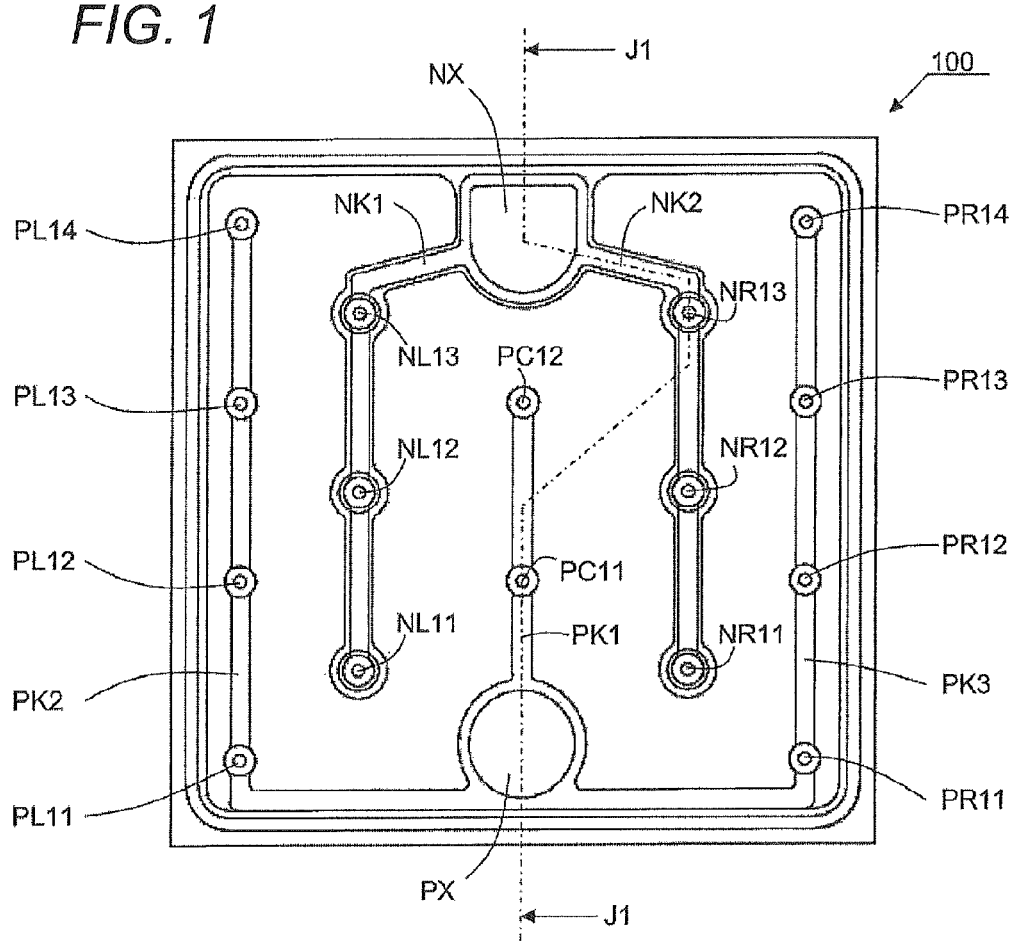
FIG. 1 is a plan view for illustrating a light emitting device according to a first illustrative embodiment.

A semiconductor light emitting device of this illustrative embodiment is described. FIG. 1 is a plan view of a light emitting device 100 of this illustrative embodiment, which is seen from a light extraction surface. In order to understand an electrode structure, respective electrodes and wirings are shown to be visible. The light emitting device 100 is a face-up type light emitting device. A p pad electrode PX and an n pad electrode NX are provided on a light extraction surface existing at a p-type layer-side. That is, the p pad electrode PX and the n pad electrode NX are arranged so that they are exposed to the surface of the p-type layer-side.

As shown in FIG. 1, a plurality of p dot electrodes (PC11 and the like) and a plurality of n dot electrodes (NL11 and the like) are separately arranged on one surface of the light emitting device 100 of this illustrative embodiment. Also, sectional shapes of the p dot electrodes (PC11 and the like) and the n dot electrodes (NL11 and the like) in a section parallel with a light extraction surface are circular, for example. However, the sectional shapes may be polygonal. The other shapes are also possible.

The p dot electrodes (PC11 and the like) are electrically connected to the p pad electrode PX via p wirings (PK1 and the like). The p dot electrodes (PC11 and the like) and the p wirings (PK1 and the like) are p auxiliary electrodes for electrically connecting the p-type layer and the p pad electrode PX. The p dot electrodes are separated electrode portions of a positive pole that are separately arranged on the light emission surface. That is, the p auxiliary electrodes have the separated electrode portions (p dot electrodes) and the wirings (p wirings). That is, at least a part of the p auxiliary electrodes has the separated electrode portions.

The n dot electrodes (NL11 and the like) are electrically connected to the n pad electrode NX via n wirings (NK1 and the like). The n dot electrodes (NL11 and the like) and the n wirings (NK1 and the like) are n auxiliary electrodes for electrically connecting the n-type layer and the n pad electrode NX. The n dot electrodes are separated electrode portions of a negative pole that are separately arranged on the light emission surface. That is, the n auxiliary electrodes have the separated electrode portions (n dot electrodes) and the wirings (n wirings). That is, at least a part of the n auxiliary electrodes has the separated electrode portions.

As shown in FIG. 1, the p wirings PK1, PK2, PK3 are a comb p wiring portion having a comb shape. The n wirings NK1, NK2 are also a comb n wiring portion having a comb shape. The comb p wiring portion of three lines consisting of the p wirings PK1, PK2, PK3 and the comb n wiring portion of two lines consisting of the n wirings NK1, NK2 are arranged so that the respective lines are engaged with each other. The p dot electrodes (PL11 and the like) are arranged in a line shape along the lines of the comb p wiring portion of the p wirings. The n dot electrodes (NL11 and the like) are arranged in a line shape along the lines of the comb n wiring portion of the n wirings.

The p wiring PK1 electrically connects the p dot electrodes PC11, PC12 each other and also electrically connects the p dot electrodes PC11, PC12 and the p pad electrode PX. Also for the other p wirings PK2, PK3, the p wirings electrically connect the p dot electrodes each other and also connect the p dot electrodes and the p pad electrode PX. The n wiring NK1 electrically connects the n dot electrodes NL11, NL12, NL13 one another and also electrically connects the n dot electrodes NL11, NL12, NL13 and the n pad electrode NX. Also for the n wiring NK2, the n wiring electrically connects the n dot electrodes one another and connects the n dot electrodes and the n pad electrode NX.

The p dot electrodes are arranged in a first p area of a center portion and a second p area and a third p area of both sides thereof. In the first p area, the p dot electrodes PC11, PC12 are arranged in a line shape. In the second p area, the p dot electrodes PL11, PL12, PL13, PL14 are arranged in a line shape. In the third p area, the p dot electrodes PR11, PR12, PR13, PR14 are arranged in a line shape. The p dot electrodes are collectively indicated with PD.

The n dot electrodes are arranged in a first n area and a second n area. In the first n area, the n dot electrodes NL11, NL12, NL13 are arranged in a line shape. In the second n area, the n dot electrodes NR11, NR12, NR13 are arranged in a line shape. The n dot electrodes are collectively indicated with ND.

In the meantime, as shown in FIG. 1, the first n area is arranged between the first p area and the second p area. Also, the second n area is arranged between the first p area and the third p area.

Figure 2:
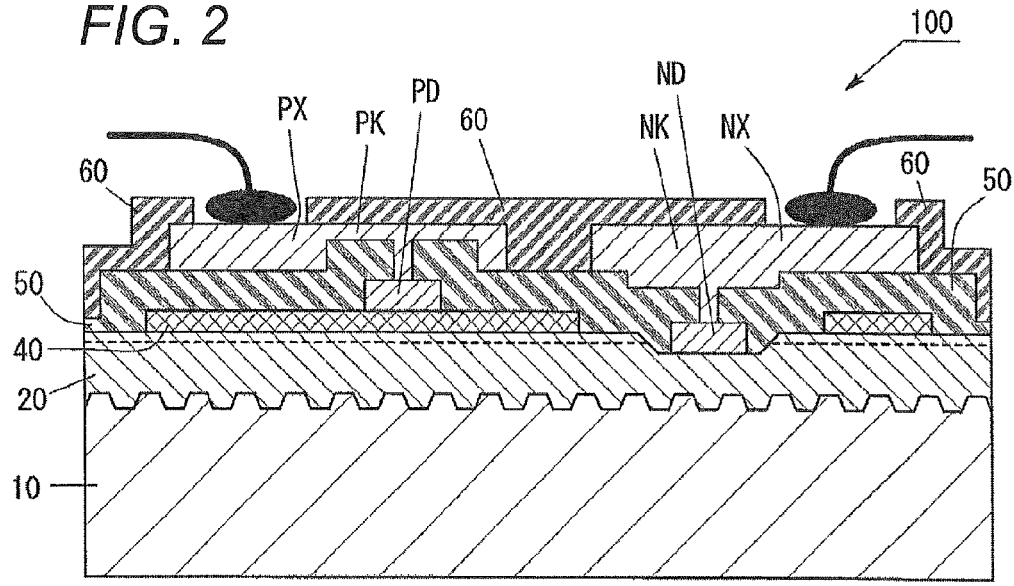
FIG. 2 is a schematic configuration view for illustrating a structure of the light emitting device according to the first illustrative embodiment.

FIG. 2 is a pictorial view showing a sectional structure of the light emitting device 100, which is taken along a line J1-J1 of FIG. 1. In FIG. 2, the p dot electrodes PC11, PC12, PL11, PL12, PL13, PL14, PR11, PR12, PR13, PR14 shown in FIG. 1 are collectively indicated with the p dot electrode PD. Likewise, the n dot electrodes NL11, NL12, NL13, NR11, NR12, NR13 shown in FIG. 1 are collectively indicated with the n dot electrode ND.

The light emitting device 100 has a sapphire substrate 10, a semiconductor layer 20, a conductive transparent film 40, insulation layers 50, 60, the p dot electrode PD, the p wiring PK, the p pad electrode PX, the n dot electrode ND, the n wiring NK and the n pad electrode NX.

The semiconductor layer 20 is a stacked layer made of GaN-based semiconductor. The semiconductor layer 20 has an n-type layer, a light emission layer and a p-type layer. The n-type layer has an n-type contact layer, an electrostatic withstanding voltage layer and an n-type clad layer. The light emission layer is positioned between the p-type layer and the n-type layer. The light emission layer is an MQW layer in which an InGaN layer and an AlGaN layer are repeatedly stacked. Also, the light emission layer may be a layer in which a GaN layer and an AlGaN layer are repeatedly stacked. The other MQW layer is also possible. Also, the light emission layer may be an SQW layer. The p-type layer has a p-type clad layer and a p-type contact layer. As the semiconductor layer 20, the GaN-based semiconductor has been exemplified. However, the invention is not limited thereto. That is, a III-group nitride semiconductor other than the GaN-based semiconductor is also possible. Also, the other semiconductors are possible.

The conductive transparent film 40 is a conductive layer that contacts the p-type contact layer of the semiconductor layer 20. The conductive transparent film 40 is made of ITO.

In addition to this, ICO, IZO, ZnO, TiO$_2$, NbTiO$_2$, TaTiO$_2$ and the like may be also used. The insulation layers 50, 60 are transparent films made of an insulating material. For example, SiO$_2$ may be used. In addition to this, the other insulating and transparent materials may be also adopted.

Here, the p dot electrode PD is formed to directly contact the conductive transparent film 40. The p dot electrode PD is electrically connected to the p wiring PK. Like this, the p-type contact layer of the semiconductor layer 20 is electrically connected to the p pad electrode PX via the conductive transparent film 40, the p dot electrode PD and the p wiring PK. The n dot electrode ND is directly formed on the n-type contact layer of the semiconductor layer 20. To this end, a part of the n-type contact layer is exposed and the n not electrode ND is formed on the exposed place. The n dot electrode ND is electrically connected to the n wiring NK. Like this, the n-type contact layer of the semiconductor layer 20 is electrically connected to the n pad electrode NX via the n dot electrode ND and the n wiring NK.

In the meantime, the p dot electrode PD and n dot electrode are made of Ni/Au/Al, for example. Also, the p wiring PK and n wiring NK may be made of the same material. The p pad electrode PX and n pad electrode NX may be also made of the same material.

As shown in FIGS. 1 and 2, the p pad electrode PX and the n pad electrode NX are exposed from a protective film. Therefore, the p pad electrode PX may be integrated with the p wiring. The n pad electrode NX may be integrated with the n wiring. Actually, FIGS. 1 and 2 show that they are integrated.

As described above, the p dot electrode PD, the p wiring PK and the p pad electrode PX are electrically connected one another. They are electrically connected to the p-type contact layer via the conductive transparent film 40. Accordingly, the p dot electrode PD, the p wiring PK and the p pad electrode PX configure a conductive portion of a first polarity.

In the meantime, the n dot electrode ND, the n wiring NK and the n pad electrode NX are electrically connected one another. They are electrically connected to the n-type contact layer. Accordingly, the n dot electrode ND, the n wiring NK and the n pad electrode NX configure a conductive portion of a second polarity.

In the meantime, since the first polarity and the second polarity are defined for convenience, the polarities may be reversed. That is, when the n dot electrode ND, the n wiring NK and the n pad electrode NX are defined as the conductive portion of the first polarity, the p dot electrode PD, the p wiring PK and the p pad electrode PX configure the conductive portion of the second polarity.

2. Dot Electrodes 2-1. Arrangement Positions of Dot Electrodes

Figure 3:
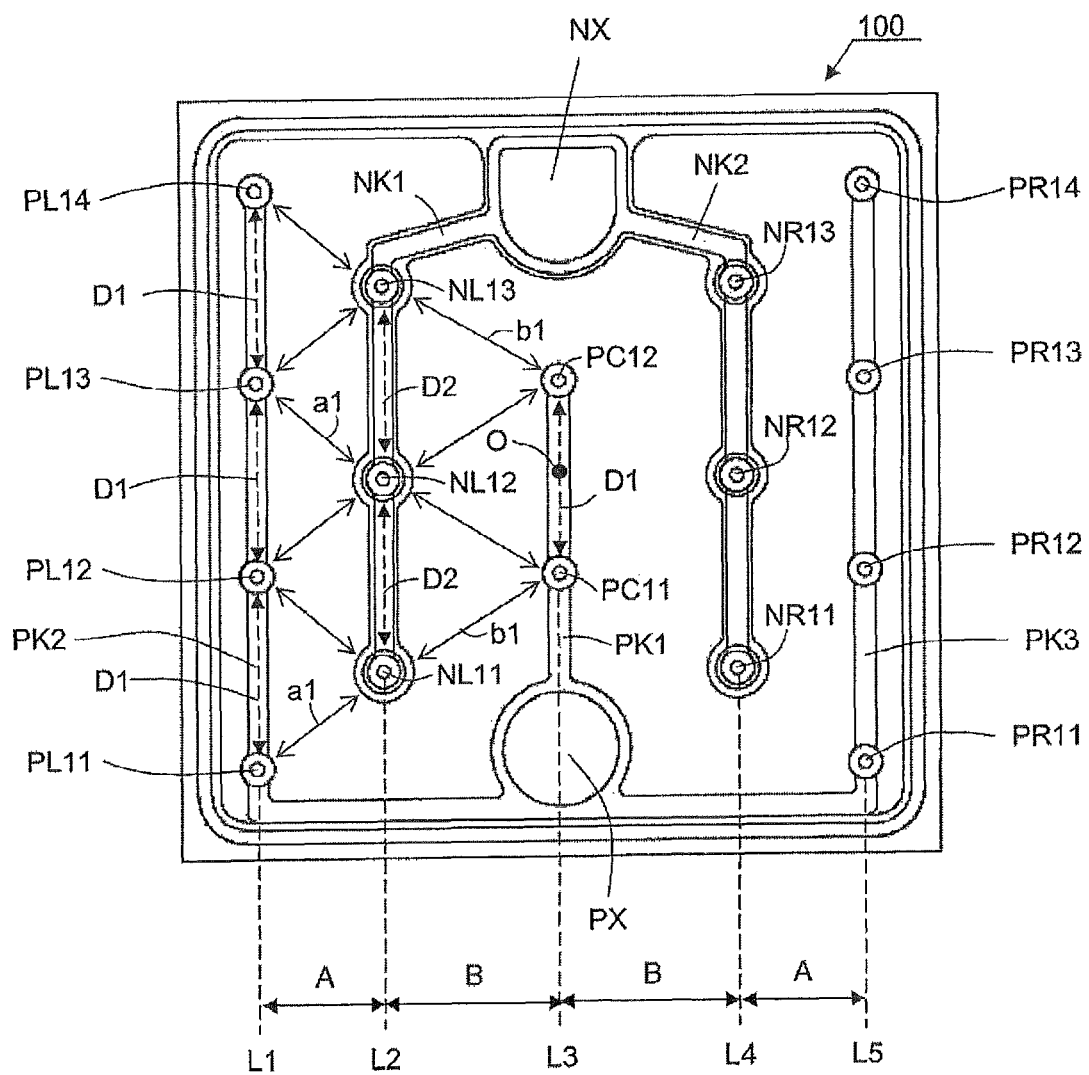
FIG. 3 is a view for illustrating arrangement positions of dot electrodes in the light emitting device according to the first illustrative embodiment.

FIG. 3 shows a planar arrangement of the p dot electrode PD and the n dot electrode ND. As shown in FIG. 3, the lines L1, L2, L3, L4, L5 are parallel with each other. The line L3 is arranged at a position at which the light emitting device 100 is bisected. In FIG. 3, a point O is provided at the center of the light emission surface of the light emitting device 100. This is imaginarily shown. That is, actually, the light emitting device 100 is not provided with the point O.

On the line L1, the p dot electrodes PL11, PL12, PL13, PL14 are arranged at an equal interval D1 in a line shape. On the line L2, the n dot electrodes NL11, NL12, NL13 are arranged at an equal interval D2 in a line shape. On the line L3, the p dot electrodes PC11, PC12 are arranged at the interval D1 in a line shape. Here, the interval D1 and the interval D2 are the same.

The point O is positioned at a halfway point between the p dot electrode PC11 and the p doe electrode PC12. The positions of the n dot electrodes NL11, NL12 in the line direction are the same as that of the point O in the line direction. That is, the positions of the halfway points in the line direction between the p dot electrodes arranged at the equal interval D1 in a line shape are the same as the positions of the n dot electrodes in the line direction arranged at the equal interval D2 in a line shape. The line L4 is symmetrical with the line L2 about the line L3 that is a symmetrical axis. The line L5 is symmetrical with the line L1 about the line L3 that is a symmetrical axis.

2-2. Inter-Dot Electrode Distance

Here, an inter-dot electrode distance is described. In this illustrative embodiment, the inter-dot electrode distance means a distance between the dot electrodes having different polarities, i.e., a closest inter-electrode distance. That is, the inter-dot electrode distance is a distance between the separated electrode portion (each p dot electrode PD) of the p auxiliary electrode and the separated electrode portion (each n dot electrode ND) of the n auxiliary electrode closest to the corresponding separated electrode portion.

An inter-dot electrode distance between the p dot electrode PL11 and the n dot electrode NL11 closest to the p dot electrode PL11 is a1. Likewise, the inter-dot electrode distances between the p dot electrodes PL11, PL12, PL13, PL14 arranged on the line L1 and the n dot electrodes NL11, NL12, NL13 arranged on the line L2 and closest to the respective p dot electrodes are a1.

An inter-dot electrode distance between the p dot electrode PC11 and the n dot electrode NL11 closest to the p dot electrode PC11 is b1. Likewise, the inter-dot electrode distances between the p dot electrodes PC11, PC12 arranged on the line L3 and the n dot electrodes NL11, NL12, NL13 arranged on the line L2 and closest to the respective p dot electrodes are b1.

2-3. Inter-Line Distance

Here, an inter-line distance is described. The line L1 is a first line that is farthest from the point O. The line L2 is a second line that is farthest from the point O next to the line L1. The line L3 is a third line that is closest to the point O. The line L2 is also a fourth line that is closest to the point O next to the line L3. That is, the line L2 serves both the second line and the fourth line.

In this illustrative embodiment, a distance A between the line L1 and the line L2 is smaller than a distance B between the line L2 and the line L3. Therefore, the inter-dot electrode distance a1 is smaller than the inter-dot electrode distance b1. That is, the distance between the line that is far from the center point O of the light emitting device 100 and the line that is closest to the corresponding line is small.

For the dot electrodes of the line farther from the center point O of the light emitting device 100, the inter-dot electrode distance is smaller. To the contrary, for the dot electrodes of the line closer to the center point O of the light emitting device 100, the inter-dot electrode distance is larger. That is, the farther from the center point O of the light emitting device 100, the electrodes are densely provided. Therefore, the farther from the center point O of the light emitting device 100, a dot electrode density becomes higher. On the other hand, the closer to the center point O of the light emitting device 100, the dot electrode density becomes lower.

Therefore, for example, the p dot electrode PC11 and the n dot electrodes NL11, NL12 form an isosceles triangle. A length of the base thereof is D2 and a height thereof is the distance B. In the meantime, the n dot electrode NL11 and the p dot electrodes PL11, PL12 form an isosceles triangle. A length of the base thereof is D1 and a height thereof is the distance A. The bases of the isosceles triangles are the same (D1=D2). The heights of the isosceles triangles are different.

As described above, in the light emitting device 100, the dot electrodes are loosely provided at the position closer to the center point O of the light emission surface and the dot electrodes are densely provided at the position farther from the center point O of the light emission surface.

3. Inter-Dot Electrode Distance and Light Emission Tendency 3-1. Current Density The light emission tendency of the light emitting device 100 depends on a distribution of a current density on the light emission surface. Thus, the current density is first described. Here, a current path between the n dot electrode NL11 and the p dot electrode PC11 is exemplified. The electrons are injected from the n dot electrode NL11 into the n-type contact layer and are spread into the n-type contact layer in a horizontal direction (light emission surface direction) and a part of the electrons flow in a vertical direction (direction perpendicular to the light emission surface). That is, the electrons flowing in the vertical direction reach the p dot electrode PC11 via the light emission layer, the p-type contact layer and the conductive transparent film 40.

Therefore, the current density depends on a resistance of the electrons in the horizontal direction, i.e., electric resistances of the n-type contact layer and the conductive transparent film 40. Thus, the closer the distance between the n dot electrode (NL11 and the like) and the p dot electrode (PL11 and the like), the current is more apt to flow.

3-2. Light Emission Tendency in Conventional Light Emitting Device

In the meantime, according to the conventional semiconductor light emitting device, the center portion of the light emitting device is bright and the peripheral portion thereof is darker, compared to the center portion. The reason is a tendency that the current flowing in the light emitting device concentrates on the center portion and is difficult to flow to the peripheral portion. This tendency is caused because it is difficult for the current to sufficiently spread into the light emission surface of the light emission layer. Hence, a technology enabling the current to flow to the peripheral portion by the dot electrodes has been developed. However, the tendency that the current is apt to concentrate on the center portion remains.

3-3. Light Emission Tendency in Light Emitting Device of this Illustrative Embodiment Accordingly, when the current is enabled to easily flow at the peripheral portion, it is possible to realize the substantially uniform light emission tendency in the light emission surface. That is, in the light emitting device 100 of this illustrative embodiment, the current is enabled to easily flow at the peripheral portion, so that a light emission output at the center portion of the light emission surface is made to be substantially same as that at the peripheral portion.

3-4. Control on Light Emission Tendency

The light emission tendency of the light emitting device 100 can be controlled by setting arrangement positions of the respective dot electrodes. By adjusting the inter-dot electrode distance, it is possible to adjust the electric resistance. By appropriately selecting the inter-electrode distance, it is possible to make the in-plane current density of the light emission layer uniform.

4. Test 4-1. Test Method

In the below, a test that has been performed for the light emitting device 100 of this illustrative embodiment is described. In this test, the brightness and the like of the light emitting device 100 were measured while changing the inter-dot electrode distances a1, b1 of FIG. 3.

Figure 4:
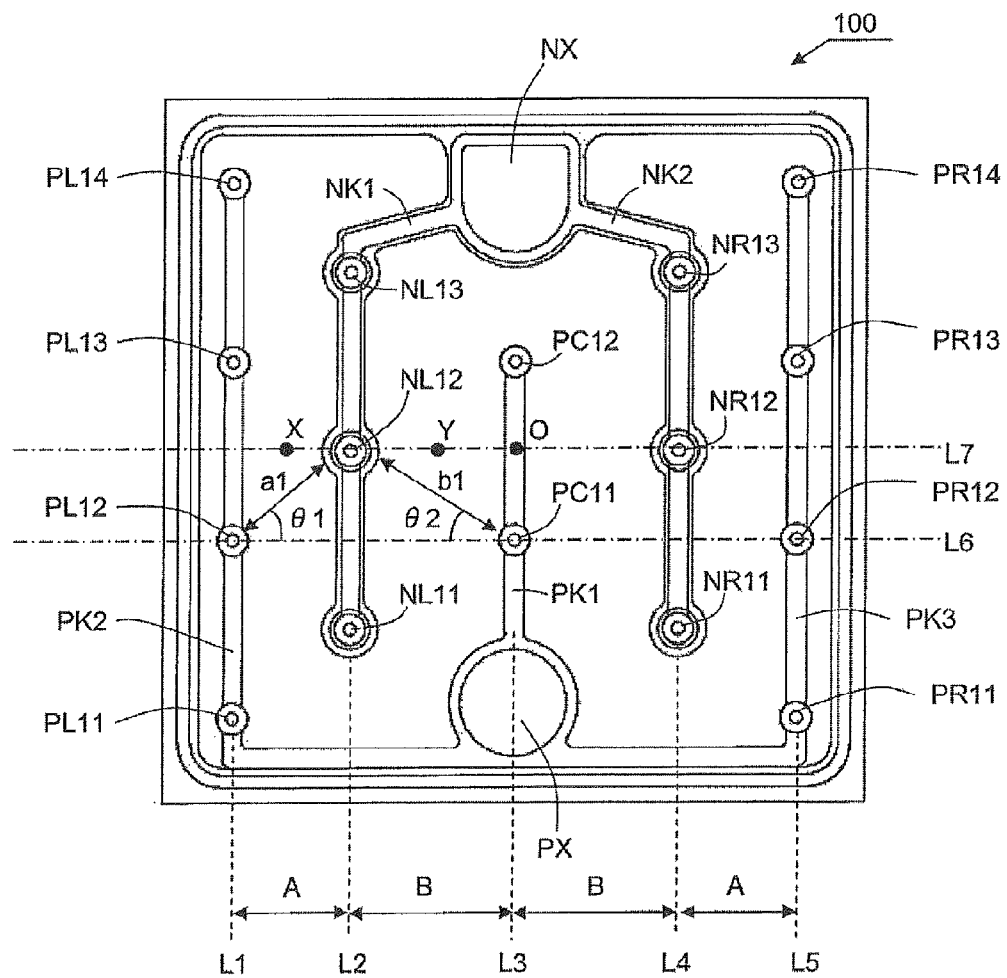
FIG. 4 is a view for illustrating a test method that has been performed for the light emitting device according to the first illustrative embodiment.

Specifically, as shown in FIG. 4, the inter-dot electrode distance is adjusted by changing a ratio of the distance A between the line L1 and the line L2 and the distance B between the line L2 and the line L3. Here, the distances A and B can be expressed using a1 and b1. That is, following mathematic formulae are satisfied.

$$A = a1 \times \cos(\theta 1)$$

$$B = b1 \times \cos(\theta 2)$$

Here, the angle θ1 is an angle formed by a line connecting the n dot electrode NL12 and the p dot electrode PL12 and a line L6. The angle θ2 is an angle formed by a line connecting the n dot electrode NL12 and the p dot electrode PC11 and the line L6. The line L6 is a line passing through the p dot electrode PC11 and the p dot electrode PL12.

In the test, the brightness and the like were measured with B/A having following three values. A corresponding relation between B/A and b1/a1 were as follows.

| Ratio of Inter-Line Distances (B/A) | Ratio of Inter-Dot Electrode Distances (b1/a1) |
|---|---|
| 1 | 1.00 |
| 1.4 | 1.27 |
| 2 | 1.61 |

The light emission intensity was measured at places X and Y in FIG. 4. The place X is a halfway point of the lines L1 and L2 and is on a line L7. The place Y is a halfway point of the lines L2 and L3 and is on the line L7. In the meantime, the line L7 is a line connecting the point O and the n dot electrode NL12. Like this, the place X is positioned at the outer location than the place Y.

Therefore, when B/A is changed, the place X and the place Y indicate the theoretically different positions. For example, the place X and the place Y indicate the different positions when B/A is 1 and when B/A is 2. Like this, a deviation (horizontal direction in FIG. 4) of the measuring places is caused. However, this only indicates the place X and the place Y with the points for explanations. The following test values are actually average values of the peripheral areas of the place X and place Y. Therefore, the problem due to the deviation does not occur.

Here, an intensity ratio (Y/X) of the light emission intensity indicates a light emission intensity at the place Y on the basis of a light emission intensity at the place X.

4-2. Test Result 1

A table 1 indicates a ratio of the light emission intensities when the ratio (b1/a1) of the inter-electrode distances is changed. As shown in the table 1, when B/A is 1.4, the intensity ratio (Y/X) was approximately 1. That is, the light emission intensity at the place X is the substantially same as the light emission intensity at the place Y.

TABLE 1

| B/A | b1/a1 | Intensity Ratio (Y/X) |
|---|---|---|
| 1 | 1.00 | 1.14 |
| 1.4 | 1.27 | 0.97 |
| 2 | 1.61 | 0.81 |

When the ratio (b1/a1) of the inter-dot electrode distances was 1, the light emission intensity ratio was 1.14. That is, the light emission intensity at the center portion in the light emission surface is higher than that at the peripheral portion.

When the ratio (b1/a1) of the inter-dot electrode distances was 1.27, the light emission intensity ratio was 0.97. That is, the light emission intensity at the place X is the substantially same as that at the place Y. That is, the light emission intensity is substantially uniform in the light emission surface.

When the ratio (b1/a1) of the inter-dot electrode distances was 1.61, the light emission intensity ratio was 0.81. That is, the light emission intensity at the center portion in the light emission surface is lower than that at the peripheral portion.

Figure 5:
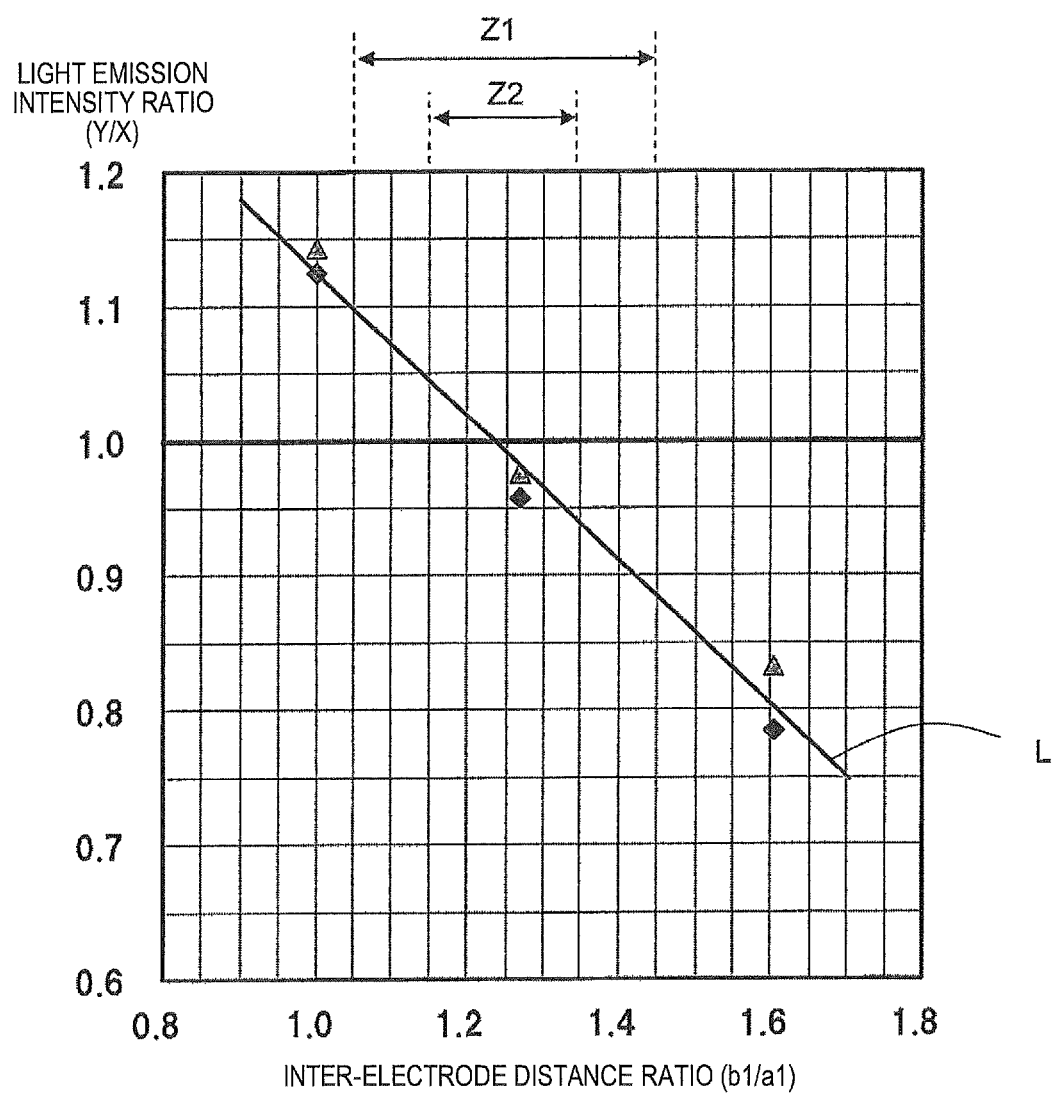
FIG. 5 is a graph showing a result of the test performed for the light emitting device according to the first illustrative embodiment.

FIG. 5 is a graph showing the ratio (b1/a1) of the inter-dot electrode distances and the intensity ratio of the light emission intensities at the places X and Y. A horizontal axis of FIG. 5 indicates the ratio (b1/a1) of the inter-dot electrode distances. A vertical axis of FIG. 5 indicates the intensity ratio (Y/X) of the light emission intensities. A line L is a line interpolating the measured values.

As shown in FIG. 5, the larger the ratio (b1/a1) of the inter-dot electrode distances, the intensity ratio (Y/X) of the light emission intensities becomes smaller. That is, when the inter-dot electrode distance is made to be smaller at the outer side, the light emission intensity at the peripheral portion tends to be higher.

As shown with the line L in FIG. 5, the ratio of the inter-dot electrode distances and the intensity ratio of the light emission intensities have a linear relation. When the inter-dot electrode distance is made to be smaller as the position is farther from the point O, the tendency remains that the light emission intensity of the peripheral portion is higher than that of the center portion.

Here, when the ratio (b1/a1) of the inter-dot electrode distances is within a range of 1.05 or larger and 1.45 or smaller, the light emission intensity ratio is within a range of 1.0±10%. That is, the range is expressed by a following mathematic formula.

$$1.05 \le b1/a1 \le 1.45$$

This is a range that is shown with Z1 in FIG. 5. At this time, the slightly non-uniform light emission is made in the light emission surface.

When the ratio (b1/a1) of the inter-dot electrode distances is within a range of 1.15 or larger and 1.35 or smaller, the light emission intensity ratio is within a range of 1.0±5%. That is, the range is expressed by a following mathematic formula.

$$1.15 \le b1/a1 \le 1.35$$

This is a range that is shown with Z2 in FIG. 5. At this time, the slightly uniform light emission is made in the light emission surface.

From FIG. 5, when the ratio (b1/a1) of the inter-dot electrode distances is 1.25, it seems that the most uniform light emitting state is realized.

4-3. Test Result 2

A table 2 indicates a whole radiant flux Po when the ratio (b1/a1) the inter-electrode distances is changed. As shown in the table 2, when the ratio (b1/a1) the inter-electrode distances was 1.00, the whole radiant flux Po was 144.9 mW. When the ratio (b1/a1) the inter-electrode distances was 1.27, the whole radiant flux Po was 146.7 mW. When the ratio (b1/a1) the inter-electrode distances was 1.61, the whole radiant flux Po was 146.2 mW.

TABLE 2

| B/A | b1/a1 | Whole Radiant Flow Po (mW) |
| --- | --- | --- |
| 1 | 1.00 | 144.9 |
| 1.4 | 1.27 | 146.7 |
| 2 | 1.61 | 146.2 |

Like this, when the ratio (b1/a1) of the inter-electrode distances is 1.05 or larger and 1.70 or smaller, the brightness by the light emission of the light emitting device 100 is bright. In particular, when the ratio (b1/a1) of the inter-electrode distances is 1.25 or larger and 1.65 or smaller, the more preferable result is obtained.

5. Summary

As specifically described above, according to the light emitting device 100 of this illustrative embodiment, the farther from the center point O of the light emission surface, the inter-dot electrode distance becomes narrower. That is, the farther from the center point O of the light emission surface, the electrode density becomes higher. To the contrary, the closer to the center point O of the light emission surface, the inter-dot electrode distance becomes wider. That is, the closer to the center point O of the light emission surface, the electrode density becomes lower. Therefore, the electric resistance between the electrodes at the peripheral portion of the light emission surface is lower than the electric resistance between the electrodes at the center portion. Thereby, the light emitting device 100 making the luminance uniform in the light emission surface is realized.

Since the substantially uniform light emission is realized in the light emission surface, the light emission output of the light emitting device 100 is higher. Also, it is possible to prevent the vicinity of the center O of the light emitting device 100 from being rapidly deteriorated.

In the meantime, this illustrative embodiment is just exemplary. Thus, various improvements and modifications can be made without departing from a gist thereof. In this illustrative embodiment, the p dot electrodes are arranged in three lines and the n dot electrodes are arranged in two lines. However, the invention is not limited thereto. Also, it is not necessarily required that the lines should be linearly arranged.

Second Illustrative Embodiment

Figure 6:
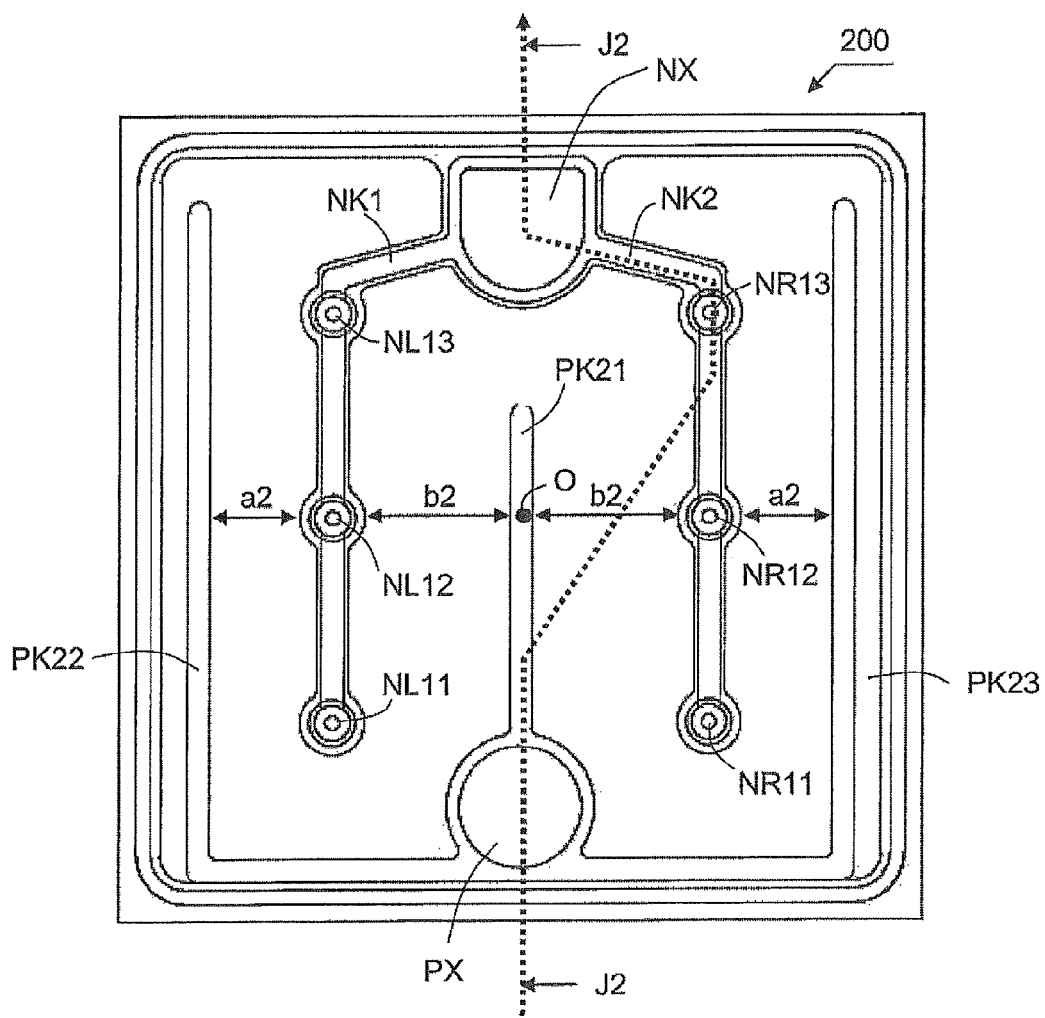
FIG. 6 is a view for illustrating arrangement positions of dot electrodes in a light emitting device according to a second illustrative embodiment.

A second illustrative embodiment is described. A light emitting device 200 of this illustrative embodiment is shown in FIG. 6. The light emitting device 200 is different from the light emitting device 100 of the first illustrative embodiment as regards the electrodes. The other configurations of the light emitting device 200 are the same as those of the light emitting device 100 of the first illustrative embodiment. The light emitting device 200 is not provided with the p dot electrodes. The p auxiliary electrodes are directly provided to the p-type contact layer 40. Instead of this, as shown in FIG. 6, the light emitting device 200 is provided with p wirings PK21, PK22, PK23. Thus, the common descriptions to the first illustrative embodiment are omitted.

1. Semiconductor Light Emitting Device

Figure 7:
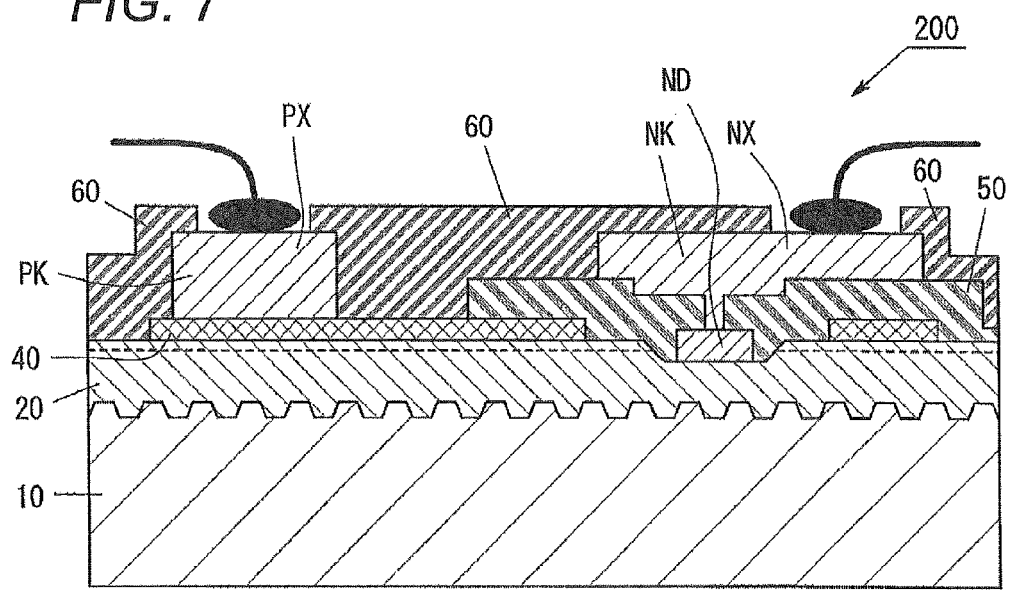
FIG. 7 is a schematic configuration view for illustrating a structure of the light emitting device according to the second illustrative embodiment.

FIG. 7 is a pictorial view showing a sectional structure of the light emitting device 200, which is taken along a line J2-J2 of FIG. 6. The light emitting device 200 has the sapphire substrate 10, the semiconductor layer 20, the conductive transparent film 40, the insulation layers 50, 60, the p wiring PK, the p pad electrode PX, the n dot electrode ND, the n wiring NK and the n pad electrode NX.

The p wiring PK is a comb p electrode portion having the p wirings PK21, PK22, PK23 of FIG. 6. The p wiring is provided to contact the conductive transparent film 40. That is, the p wirings PL21, PK22, PK23 are directly contacted to the conductive transparent film 40. The n wirings NK1, NK2 are a comb n wiring portion having a comb shape.

2. Arrangement of Dot Electrodes

Subsequently, positions at which the dot electrodes are arranged are described. The n dot electrodes NL11, NL12, NL13 are arranged at positions closer to the p wiring PK22 than the p wiring PK21. The n dot electrodes NR11, NR12, NR13 are also arranged at positions closer to the p wiring PK23 than the p wiring PK21.

A distance between the n dot electrode NL12 and the p wiring PK22 is a2, as shown in FIG. 6. A distance between the n dot electrode NL11 or NL13 and the p wiring PK22 is also a2.

A distance between the n dot electrode NL12 and the p wiring PK21 is b2, as shown in FIG. 6. A distance between the n dot electrode NL11 or NL13 and the p wiring PK21 is also b2.

The closest inter-electrode distances a2, b2 have a following relation.

$$a2 < b2 \qquad (1)$$

In this illustrative embodiment, a closest inter-electrode distance is a distance between the n dot electrode and the p wiring. As shown with the mathematic formula (1), the farther from the center point O of the light emitting device 200, the closest inter-electrode distance becomes smaller. That is, the farther from the center point O of the light emitting device 200, the electrode density becomes higher. On the other hand, the closer to the center point O of the light emitting device 200, the closest inter-electrode distance becomes larger. That is, the closer to the center point O of the light emitting device 200, the electrode density becomes lower.

As described above, in the light emitting device 200, the dot electrodes are loosely provided at the position closer to the center point O of the light emission surface and the dot electrodes are densely provided at the position farther from the center point O of the light emission surface.

Therefore, like the light emitting device 100 of the first illustrative embodiment, the current is apt to flow to the peripheral portion of the light emitting device 200 of this illustrative embodiment. That is, the light emitting device 200 substantially uniformly emits the light in the light emission surface.

3. Summary

As specifically described above, according to the light emitting device 200 of this illustrative embodiment, the farther from the center point O of the light emission surface, the inter-dot electrode distance becomes narrower. That is, the farther from the center point O of the light emission surface, the electrode density becomes higher. To the contrary, the closer to the center point O of the light emission surface, the inter-dot electrode distance becomes wider. That is, the closer to the center point O of the light emission surface, the electrode density becomes lower. Therefore, the electric resistance between the electrodes at the peripheral portion of the light emission surface is lower than the electric resistance between the electrodes at the center portion. Thereby, the light emitting device 200 making the luminance uniform in the light emission surface is realized.

Since the substantially uniform light emission is realized in the light emission surface, the light emission output of the light emitting device 200 is higher. Also, it is possible to prevent the vicinity of the center O of the light emitting device 200 from being rapidly deteriorated.

In the meantime, this illustrative embodiment is just exemplary. Thus, various improvements and modifications can be made without departing from a gist thereof. In this illustrative embodiment, the n dot electrodes are arranged in two lines. However, the invention is not limited thereto. Also, it is not necessarily required that the lines should be linearly arranged.

Third Illustrative Embodiment

Figure 8:
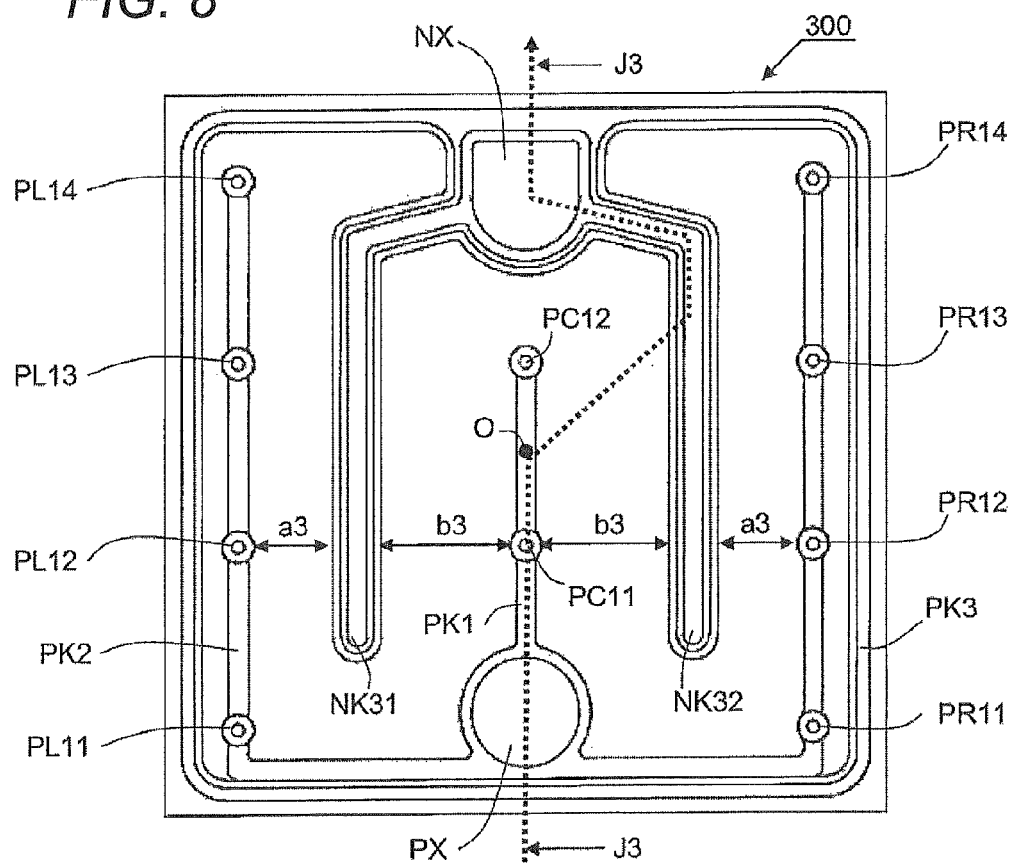
FIG. 8 is a view for illustrating arrangement positions of dot electrodes in a light emitting device according to a third illustrative embodiment.

A third illustrative embodiment is described. A light emitting device 300 of this illustrative embodiment is shown in FIG. 8. The light emitting device 300 is different from the light emitting device 100 of the first illustrative embodiment as regards the electrodes. The other configurations of the light emitting device 300 are the same as those of the light emitting device 100 of the first illustrative embodiment. The light emitting device 300 is not provided with the n dot electrodes. Like this, since there are many common points to the first illustrative embodiment, the common descriptions to the first illustrative embodiment are omitted.

1. Semiconductor Light Emitting Device

Figure 9:
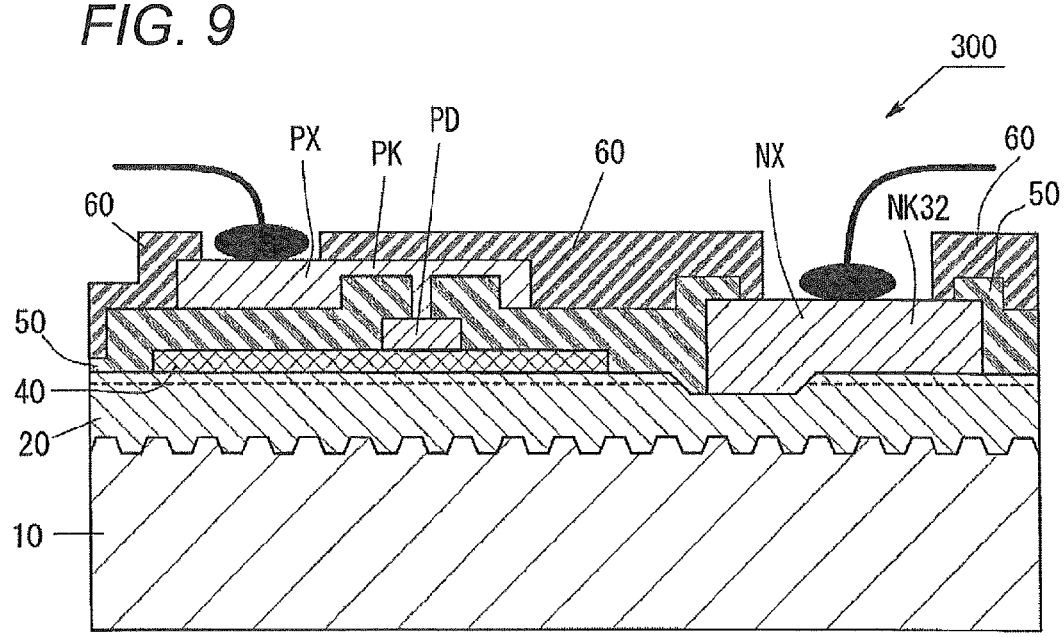
FIG. 9 is a schematic configuration view for illustrating a structure of the light emitting device according to the third illustrative embodiment.

FIG. 9 is a pictorial view showing a sectional structure of the light emitting device 300, which is taken along a line J3-J3 of FIG. 8. FIG. 3 does not show a specific section but is a conceptual view. The light emitting device 300 has the sapphire substrate 10, the semiconductor layer 20, the conductive transparent film 40, the insulation layers 50, 60, the p dot electrode PD, the p wiring PK, the p pad electrode PX, the n wiring NK and the n pad electrode NX.

The n wiring PK is a comb n electrode portion having the n wirings NK31, NK22 of FIG. 8. The n wirings NK31, NK32 are provided to contact the n-type contact layer of the semiconductor layer 20. The p wirings PK1, PK2, PK3 are a comb p wiring portion having a comb shape.

2. Arrangement of Dot Electrodes

Subsequently, positions at which the dot electrodes are arranged are described. A distance between the p dot electrode PL12 and the n wiring NK31 is a3. A distance between the p dot electrode PL13 and the n wiring NK31 is a3.

A distance between the p dot electrode PC11 and the n wiring NK31 is b3. A distance between the p dot electrode PC12 and the n wiring NK31 is also b3.

The closest inter-electrode distances a3, b3 have a following relation.

$$a3 < b3 \qquad (2)$$

In this illustrative embodiment, a closest inter-electrode distance is a distance between the p dot electrode and the n wiring. As shown with the mathematic formula (2), the farther from the center point O of the light emitting device 300, the closest inter-electrode distance becomes smaller. That is, the farther from the center point O of the light emitting device 300, the electrode density becomes higher. On the other hand, the closer to the center point O of the light emitting device 300, the closest inter-electrode distance becomes larger. That is, the closer to the center point O of the light emitting device 300, the electrode density becomes lower.

As described above, in the light emitting device 300, the dot electrodes are loosely provided at the position closer to the center point O of the light emission surface and the dot electrodes are densely provided at the position farther from the center point O of the light emission surface.

Therefore, like the light emitting device 100 of the first illustrative embodiment, the current is apt to flow to the peripheral portion of the light emitting device 300 of this illustrative embodiment. That is, the light emitting device 300 substantially uniformly emits the light in the light emission surface. In the meantime, a distance between the p dot electrode PL11 and the n wiring NK31 and a distance between the p dot electrode PL14 and the n wiring NK31 are slightly larger than a3. However, when the ratio b3/a3 of the inter-electrode distances is appropriately set, the substantially uniform light emission can be made.

3. Summary

As specifically described above, according to the light emitting device 300 of this illustrative embodiment, the farther from the center point O of the light emission surface, the inter-dot electrode distance becomes narrower. That is, the farther from the center point O of the light emission surface, the electrode density becomes higher. To the contrary, the closer to the center point O of the light emission surface, the inter-dot electrode distance becomes wider. That is, the closer to the center point O of the light emission surface, the electrode density becomes lower. Therefore, the electric resistance between the electrodes at the peripheral portion of the light emission surface is lower than the electric resistance between the electrodes at the center portion. Thereby, the light emitting device 300 making the luminance uniform in the light emission surface is realized.

Since the substantially uniform light emission is realized in the light emission surface, the light emission output of the light emitting device 300 is higher. Also, it is possible to prevent the vicinity of the center O of the light emitting device 300 from being rapidly deteriorated.

In the meantime, this illustrative embodiment is just exemplary. Thus, various improvements and modifications can be made without departing from a gist thereof. In this illustrative embodiment, the p dot electrodes are arranged in three lines. However, the invention is not limited thereto. Also, it is not necessarily required that the lines should be linearly arranged.

Fourth Illustrative Embodiment

Figure 10:
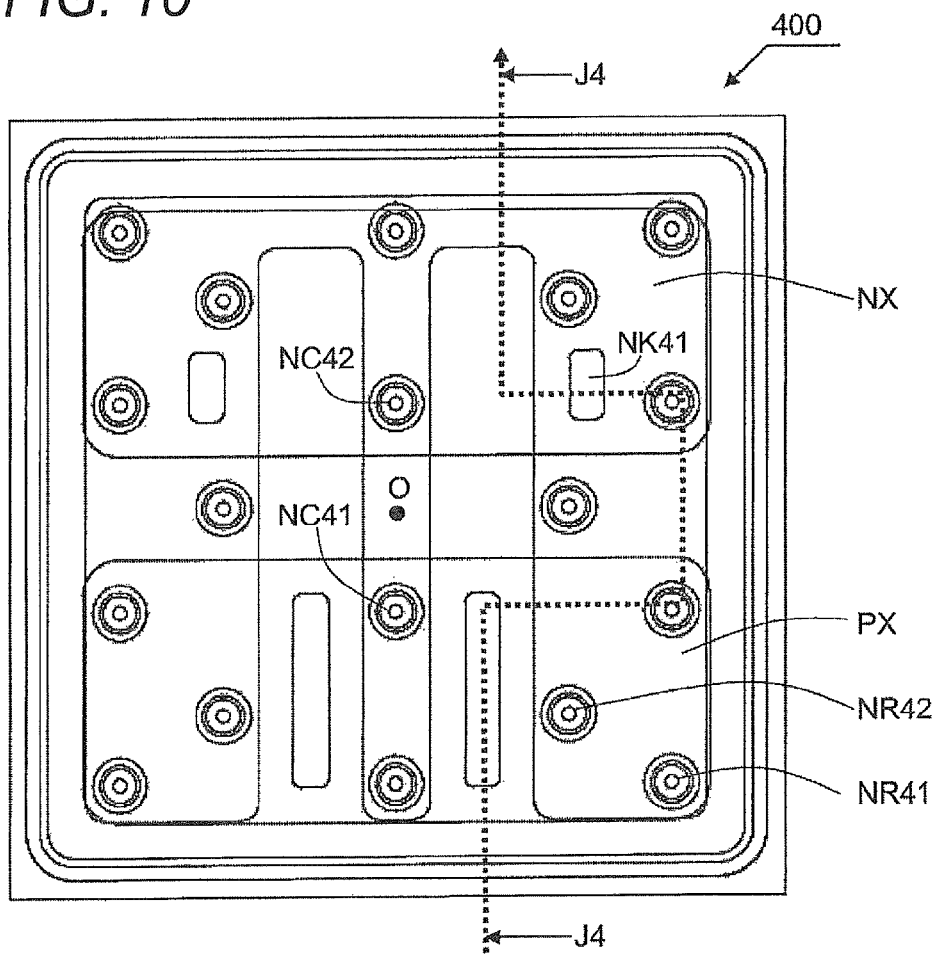
FIG. 10 is a projection view for illustrating a structure of a light emitting device according to a fourth illustrative embodiment.

A fourth illustrative embodiment is described. A light emitting device 400 of this illustrative embodiment is shown in FIG. 10. The light emitting device 400 is a flip chip-type light emitting device in which the p pad electrode PX and the n pad electrode NX are provided on an opposite side to the light extraction surface. The light emitting device 400 is not provided with the p dot electrodes. In the below, the different points from the first illustrative embodiments are described.

1. Semiconductor Light Emitting Device

Figure 11:
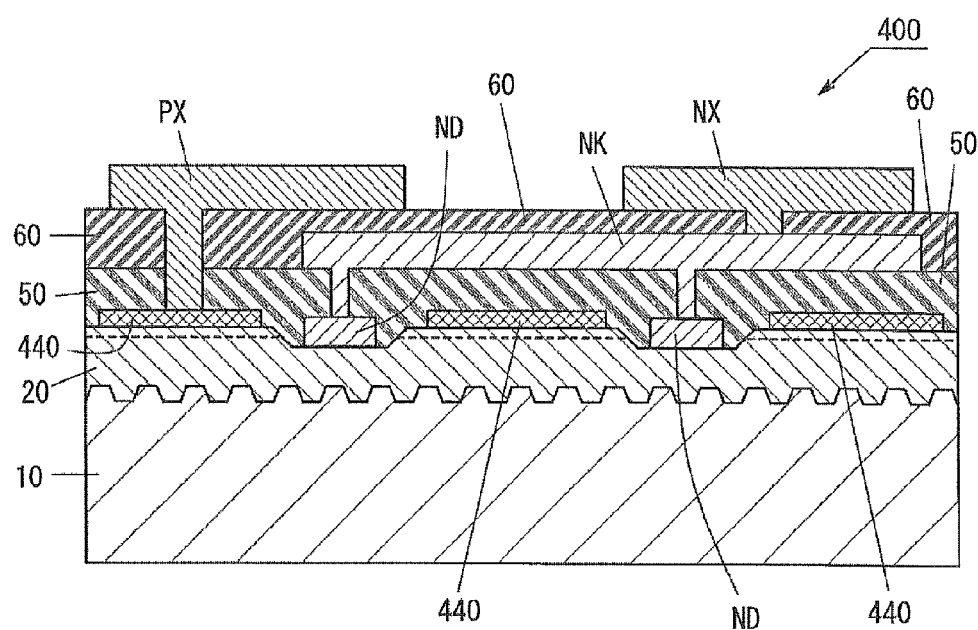
FIG. 11 is a schematic configuration view for illustrating the structure of the light emitting device according to the fourth illustrative embodiment.

FIG. 11 is a pictorial view showing a sectional structure of the light emitting device 400, which is taken along a line J4-J4 of FIG. 10. The light emitting device 400 has the sapphire substrate 10, the semiconductor layer 20, a reflective film 440, the insulation layers 50, 60, the p pad electrode PX, the n dot electrode ND, the n wiring NK and the n pad electrode NX.

The reflective film 440 is a film that reflects the light and is made of a conductive material. For example, Al, Al alloy, Ag, Ag alloy and the like may be used. The reflective film 440 is directly contacted to the p-type contact layer of the semiconductor layer 20. Thereby, the p pad electrode PX and the reflective film 440 are electrically connected. The n dot electrode NX is directly contacted to the n-type contact layer of the semiconductor layer 20. The n wiring NK is provided to electrically connect the n dot electrode ND and the n pad electrode NX. The n wiring NK is a planar electrode portion having a plane shape.

2. Arrangement of Dot Electrodes

Figure 12:
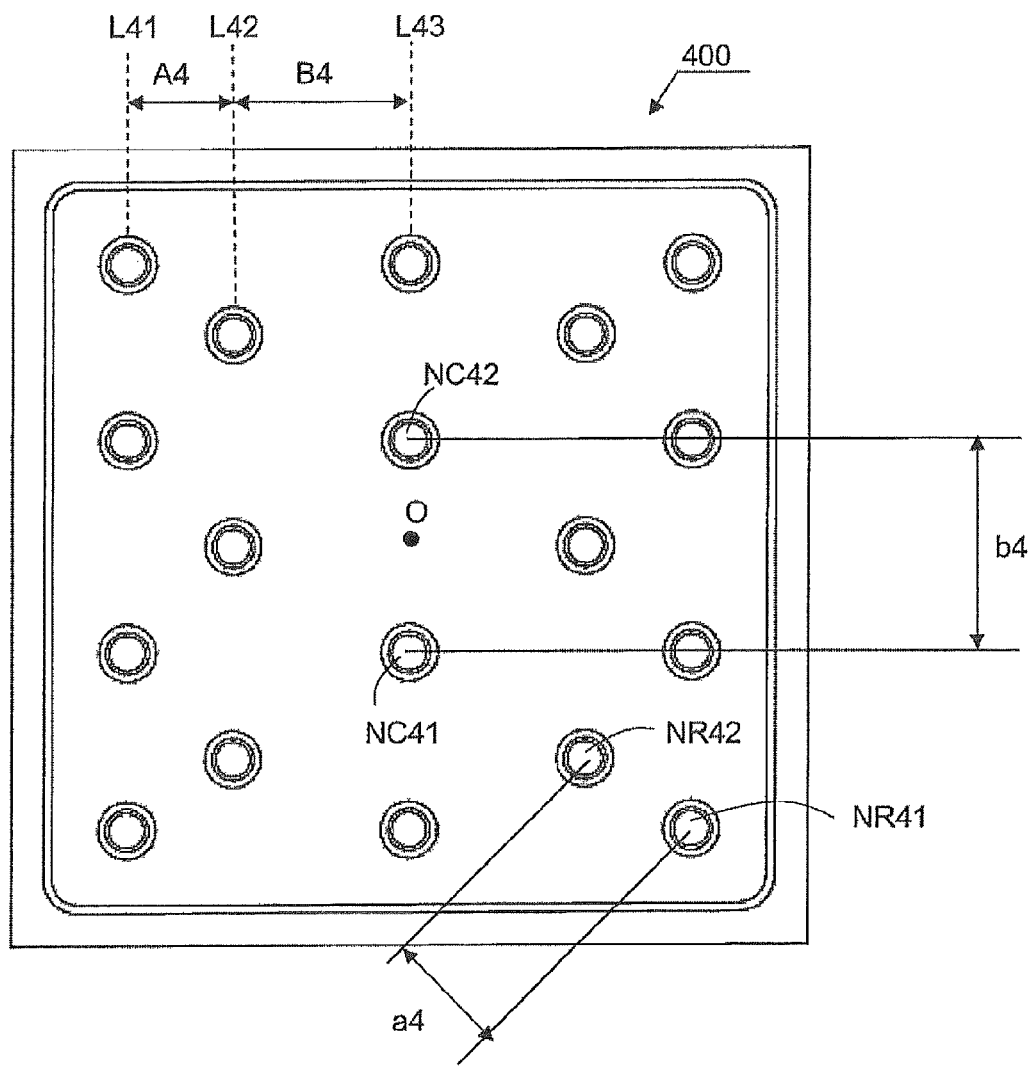
FIG. 12 is a view for illustrating arrangement positions of dot electrodes in a light emitting device according to a fourth illustrative embodiment.

Subsequently, positions at which the dot electrodes are arranged are described. In the light emitting device 400, the plurality of n dot electrodes ND is separately arranged. As shown in FIG. 12, the four n dot electrodes ND are arranged on a line L41. On a line L42, the three n dot electrodes ND are arranged. On a line L43, the four n dot electrodes ND are arranged. A distance between the line L41 and the line L42 is A4. A distance between the line L42 and the line L43 is B4. The outer distance A4 is smaller than the inner distance B4.

As shown in FIG. 12, a distance between an n not electrode NC41 and an n dot electrode NC42, which are closest to the center point O of the light emission surface, is b4. Here, the n not electrode NC41 and the n dot electrode NC42 are n dot electrodes that are closest to the center point O of the light emission surface. A distance between an n not electrode NR41 and an n dot electrode NR42 is a4. Here, the n dot electrode NR41 is an n dot electrode that is farthest from the center point O of the light emission surface. The n dot electrode NR42 is an n dot electrode that is closest to the n dot electrode NR41.

The closest inter-electrode distances a4, b4 have a following relation.

$$a4 < b4 \quad (3)$$

In this illustrative embodiment, a closest inter-electrode distance is a distance between the n dot electrodes, i.e., between the electrodes having the same polarity. As shown with the mathematic formula (3), the farther from the center point O of the light emitting device 400, the closest inter-electrode distance becomes smaller. That is, the farther from the center point O of the light emitting device 400, the electrode density becomes higher. On the other hand, the closer to the center point O of the light emitting device 400, the closest inter-electrode distance becomes larger. That is, the closer to the center point O of the light emitting device 400, the electrode density becomes lower.

As described above, in the light emitting device 400, the dot electrodes are loosely provided at the position closer to the center point O of the light emission surface and the dot electrodes are densely provided at the position farther from the center point O of the light emission surface. Therefore, like the light emitting device 100 of the first illustrative embodiment, the current is apt to flow to the peripheral portion of the light emitting device 400 of this illustrative embodiment. That is, the light emitting device 400 substantially uniformly emits the light in the light emission surface.

4. Summary

As specifically described above, according to the light emitting device 400 of this illustrative embodiment, the farther from the center point O of the light emission surface, the inter-dot electrode distance becomes narrower. That is, the farther from the center point O of the light emission surface, the electrode density becomes higher. To the contrary, the closer to the center point O of the light emission surface, the inter-dot electrode distance becomes wider. That is, the closer to the center point O of the light emission surface, the electrode density becomes lower. Thereby, the light emitting device 400 making the luminance uniform in the light emission surface is realized.

Since the substantially uniform light emission is realized in the light emission surface, the light emission output of the light emitting device 400 is higher. Also, it is possible to prevent the vicinity of the center O of the light emitting device 200 from being rapidly deteriorated.

In the meantime, this illustrative embodiment is just exemplary. Thus, various improvements and modifications can be made without departing from a gist thereof. In this illustrative embodiment, the n dot electrodes are arranged in five lines.

However, the invention is not limited thereto. Also, it is not necessarily required that the lines should be linearly arranged.

Fifth Illustrative Embodiment

A fifth illustrative embodiment is described. In the first to fourth illustrative embodiments, the distance between the lines of the dot electrodes arranged at the equal interval in a line shape is changed. In this illustrative embodiment, the outer dot electrodes of the same line are arranged at an outer position.

Figure 13:
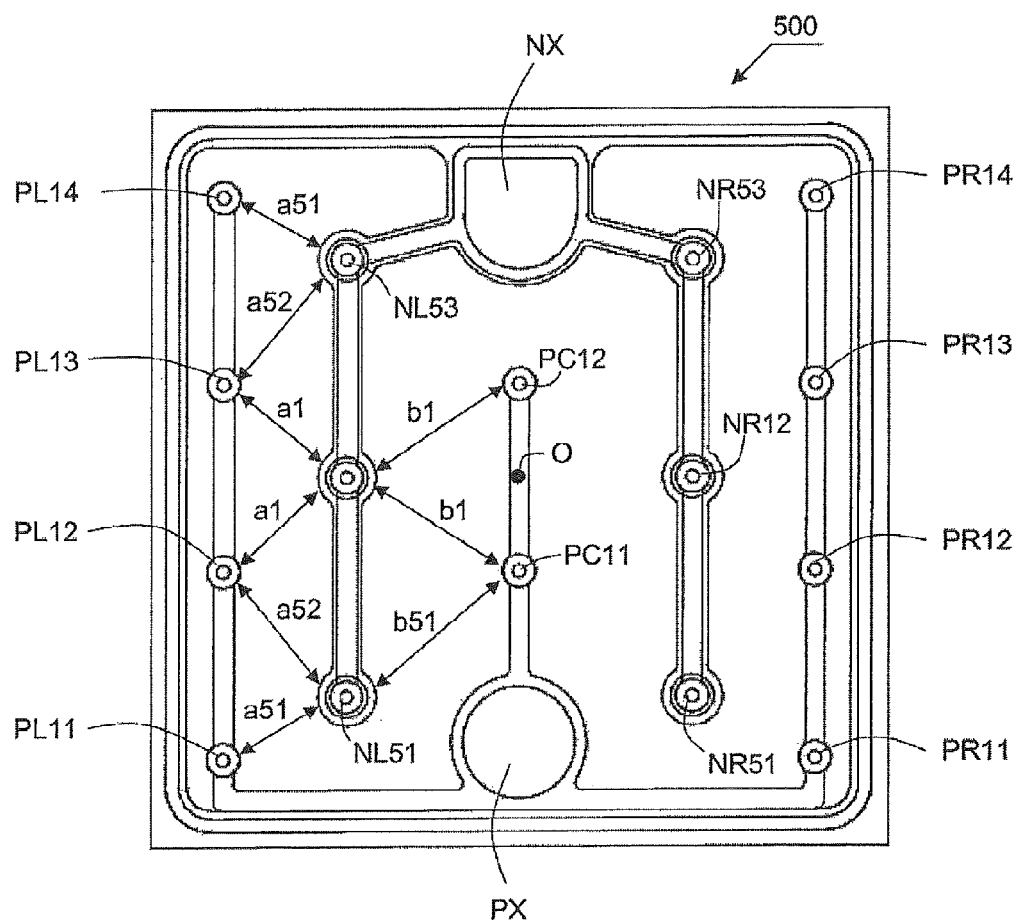
FIG. 13 is a view for illustrating arrangement positions of dot electrodes in a light emitting device according to a fifth illustrative embodiment.

A light emitting device 500 of this illustrative embodiment is shown in FIG. 13. The light emitting device 500 is different from the light emitting device 100 of the first illustrative embodiment (refer to FIG. 1) as regards the arrangement of the n dot electrodes. Thus, only the different points are described.

1. Arrangement of Dot Electrodes

As shown in FIG. 13, arrangement positions of n dot electrodes NL51, NL53, NR51, NR53 are different from those of the n dot electrodes NL11, NL13, NR11, NR13 of the light emitting device 100, respectively. The n dot electrodes NL51, NL53, NR51, NR53 are moved in an outer direction, i.e., in a line direction getting away from the point O.

Therefore, an inter-dot electrode distance a51 between the p dot electrode PL11 and the n dot electrode NL51 is smaller than the inter-dot electrode distance a1 between the p dot electrode PL12 and the n dot electrode NL12. Therefore, the farther from the center point O, the electrode density becomes higher. Also, the closer to the center point O, the electrode density becomes lower. The tendency is more remarkable than in the light emitting device 100 of the first illustrative embodiment.

In the meantime, an inter-dot electrode distance a52 between the p dot electrode PL12 and the n dot electrode NL51 is larger than the inter-dot electrode distance a1 between the p dot electrode PL12 and the n dot electrode NL12. However, the closest n dot electrode, when seen from the p dot electrode PL12, is the n dot electrode NL12. That is, the tendency remains that the farther from the center point O, the distance between the closest electrodes becomes smaller.

The n dot electrode closest to the p dot electrode PC11 is the n dot electrode NL12. A distance between the corresponding electrodes is b1. Also, the n dot electrode closest to the p dot electrode PL12 is the n dot electrode NL12. A distance between the corresponding electrodes is a1. The n dot electrode closest to the p dot electrode PL11 is the n dot electrode NL51. A distance between the corresponding electrodes is a51.

Like this, when it is assumed that the two electrodes closest to any electrode is a pair of electrodes, a distance between the pair of electrodes becomes smaller as the distance from the center point O is farther. The closer to the center point O, the distance between the pair of electrodes becomes smaller. It is needless to say that the current is apt to flow to the place having the low electric resistance. Therefore, the tendency remains that the current is apt to flow to the peripheral portion of the light emitting device 500 and is difficult to flow to the center portion.

As described above, in the light emitting device 500, the dot electrodes are loosely provided at the position closer to the center point O of the light emission surface and the dot electrodes are densely provided at the position farther from the center point O of the light emission surface.

2. Modified Embodiments

The p dot electrodes PL12, PL13, PR12, PR13 of the light emitting device 500 may be arranged so that they are deviated outwards along the line direction. In this case, the tendency that the farther from the center point O, the electrode density becomes higher is more remarkable.

3. Summary

As specifically described above, according to the light emitting device 500 of this illustrative embodiment, the farther from the center point O of the light emission surface, the inter-dot electrode distance becomes narrower. That is, the farther from the center point O of the light emission surface, the electrode density becomes higher. To the contrary, the closer to the center point O of the light emission surface, the inter-dot electrode distance becomes wider. That is, the closer to the center point O of the light emission surface, the electrode density becomes lower. Therefore, the electric resistance between the electrodes at the peripheral portion of the light emission surface is lower than the electric resistance between the electrodes at the center portion. Thereby, the light emitting device 500 making the luminance uniform in the light emission surface is realized.

Since the substantially uniform light emission is realized in the light emission surface, the light emission output of the light emitting device 500 is higher. Also, it is possible to prevent the vicinity of the center O of the light emitting device 500 from being rapidly deteriorated.

In the meantime, this illustrative embodiment is just exemplary. Thus, various improvements and modifications can be made without departing from a gist thereof. In this illustrative embodiment, the p dot electrodes are arranged in three lines and the n dot electrodes are arranged in two lines. However, the invention is not limited thereto. Also, it is not necessarily required that the lines should be linearly arranged.

What is claimed is:

1. A semiconductor light emitting device comprising:
    a first conductivity type semiconductor layer;
    a light emission layer;
    a second conductivity type semiconductor layer;
    a conductive portion of a first polarity electrically connected to the first conductivity type semiconductor layer; and
    a conductive portion of a second polarity electrically connected to the second conductivity type semiconductor layer,
    wherein at least one of the conductive portion of the first polarity and the conductive portion of the second polarity comprises a plurality of separated electrode portions arranged on a light emission surface, and
    wherein the closer the positions of the separated electrode portions are to a center point of the light emission surface, the separated electrode portions are provided sparsely, and the farther the positions of the separated electrode portions are from a center point of the light emission surface, the separated electrode portions are provided densely.

2. The semiconductor light emitting device according to claim 1,
    wherein the plurality of separated electrode portion comprise: a first separated electrode portion; and a second separated electrode portion located at a position farther from the center point than the first separated electrode portion are provided,
    wherein the second separated electrode portion comprises an electrode portion having a second closest inter-electrode distance smaller than a first closest inter-electrode distance of the first separated electrode portion, and
    wherein the closest inter-electrode distance is a distance between the separated electrode portion and the conductive portion of the first polarity closest to the separated electrode portion or the conductive portion of the second polarity closest to the separated electrode portion.

3. The semiconductor light emitting device according to claim 2,
wherein the conductive portion of the first polarity comprises the separated electrode portions of the first polarity, and
wherein the closest inter-electrode distance is a distance between the separated electrode portions of the first polarity.

4. The semiconductor light emitting device according to claim 2,
wherein the closest inter-electrode distance is a distance between a separated electrode portion of the first polarity and the conductive portion of the second polarity.

5. The semiconductor light emitting device according to claim 4,
wherein each of the conductive portion of the first polarity and the conductive portion of the second polarity comprises a plurality of the separated electrode portions, and
wherein the closest inter-electrode distance is a distance between the separated electrode portion of the conductive portion of the first polarity and the separated electrode portion of the conductive portion of the second polarity.

6. The semiconductor light emitting device according to claim 5,
wherein the conductive portion of the first polarity comprises a comb wiring portion of the first polarity that electrically connects the separated electrode portions of the first polarity each other, and
wherein the conductive portion of the second polarity comprises a comb wiring portion of a second polarity that electrically connects the separated electrode portions of the second polarity each other.

7. The semiconductor light emitting device according to claim 6,
wherein a ratio b/a is within a range of $1.05 \leq b/a \leq 1.45$, where
"a" indicates the closest inter-electrode distance, which is between the separated electrode portion positioned on a first line farthest from the center point of the light emission surface and the separated electrode portion positioned on a second line farthest from the center point of the light emission surface next to the first line, and
"b" indicates the closest inter-electrode distance, which is between the separated electrode portion positioned on a third line closest to the center point of the light emission surface and the separated electrode portion positioned on a fourth line closest to the center point of the light emission surface next to the third line.

8. The semiconductor light emitting device according to claim 7,
wherein the ratio b/a of the closest inter-electrode distance b to the closest inter-electrode distance a is within a range of $1.15 \leq b/a \leq 1.35$.

9. The semiconductor light emitting device according to claim 4,
wherein only the conductive portion of the first polarity comprises the plurality of the separated electrode portions, and
wherein the closest inter-electrode distance is a distance between the separated electrode portion of the conductive portion of the first polarity and the conductive portion of the second polarity.

10. The semiconductor light emitting device according to claim 9,
wherein the conductive portion of the first polarity comprises a comb wiring portion of a first polarity having a comb shape that electrically connects the separated electrode portions,
wherein the conductive portion of the second polarity comprises a comb electrode portion of a second polarity having a comb shape, and
wherein the closest inter-electrode distance is a distance between the separated electrode portion of the first polarity connected to the comb wiring portion of the first polarity and the comb electrode portion of the second polarity.

* * * * *